United States Patent [19]
Zasio

[11] Patent Number: 4,782,283
[45] Date of Patent: Nov. 1, 1988

[54] APPARATUS FOR SCAN TESTING CMOS INTEGRATED SYSTEMS

[75] Inventor: John J. Zasio, Sunnyvale, Calif.

[73] Assignee: AIDA Corporation, Santa Clara, Calif.

[21] Appl. No.: 899,166

[22] Filed: Aug. 22, 1986

[51] Int. Cl.$^4$ .................. G01R 15/12; G11C 11/28
[52] U.S. Cl. .................. 324/73 R; 324/158 R; 324/73 AT; 377/70
[58] Field of Search .................. 324/73 R; 371/25, 16, 371/15; 377/70; 307/272 A

[56] References Cited

U.S. PATENT DOCUMENTS

| | | | |
|---|---|---|---|
| 4,357,703 | 11/1982 | Van Brunt | 324/73 R |
| 4,495,628 | 1/1985 | Zasio | 377/70 X |
| 4,495,629 | 1/1985 | Zasio et al. | 377/70 X |
| 4,587,480 | 5/1986 | Zasio | 324/73 R X |
| 4,621,363 | 11/1986 | Blum | 324/73 R X |

Primary Examiner—Reinhard J. Eisenzopf
Assistant Examiner—Vinh P. Nguyen
Attorney, Agent, or Firm—A. C. Smith

[57] ABSTRACT

Apparatus is disclosed for establishing scan-ring testing circuitry and control logic therefor on CMOS integrated circuit chips which can then be tested thereby during fabrication, after wire bonding and packaging, and while assembled and connected with other components on a printed circuit board. Tri-state buffers fabricated on the IC chip within the scan-ring control circuitry facilitate the operation of the scan-ring testing circuitry in several distinct operating modes which enable the functional circuitry of the integrated circuit to be electrically isolated from the associated signal pads for testing of the functional circuitry independently of circuitry connected to the signal pads, and for testing circuitry connected to the signal pads independently of the function circuitry of the chip.

7 Claims, 8 Drawing Sheets

| MODE | TEST PADS | | | | | CLOCKS | | | CONTROL REGISTER | | | |
|---|---|---|---|---|---|---|---|---|---|---|---|---|
| | A | B | C | SI | SO | C0 | C1 | C2 | D | E | R | T |
| POWER UP | 0 | 0 | 0 | 0 | X | 0 | 0 | 0 | | | | |
| CONTROL SR ON | P | 0 | 1 | 1 | X | 0 | 0 | 0 | | | | |
| CONTROL SR OFF | P | 0 | 1 | 0 | X | 0 | 0 | 0 | | | | |
| LOAD CONTROL REG. | P | P | 0 | D | X | 0 | 0 | 0 | | | | |
| NORMAL OPERATION | 0 | 0 | 1 | 0 | X | P | P | P | 0 | 0 | 0 | 0 |
| INT. PROPAGATE | 1 | 1 | 0 | D | M | 0 | 0 | 0 | 0 | 0 | 0 | 0 |
| INT. RING OSC. | 1 | 1 | 0 | 0 | M | 0 | 0 | 0 | 0 | 0 | 1 | 0 |
| INT. SCAN | P | P | 0 | D | M | 0 | 0 | 0 | 0 | 0 | 0 | 0 |
| EXT. PROPAGATE | 1 | 1 | 0 | D | M | 0 | 0 | 0 | 1 | 1 | 0 | 0 |
| EXT. RING OSC. | 1 | 1 | 0 | 0 | M | 0 | 0 | 0 | 1 | 1 | 1 | 0 |
| EXT. SCAN | P | P | 0 | D | M | 0 | 0 | 0 | 1 | 1 | 0 | 0 |
| OFF PCB CHIP TEST | | | | | | | | | | | | |
|   LOAD INPUTS | 0 | 0 | 0 | X | X | P | P | P | 0 | 1 | 0 | 0 |
|   MEASURE OUTPUTS | 0 | P | P | X | X | 0 | 0 | 0 | 0 | 1 | 0 | 0 |
| ON PCB CHIP TEST | | | | | | | | | | | | |
|   LOAD INPUTS | 0 | 0 | 0 | X | X | P | P | P | 1 | 1 | 0 | 0 |
|   MEASURE OUTPUTS | 0 | P | P | X | X | 0 | 0 | 0 | 1 | 1 | 0 | 0 |
| PCB WIRING TEST | | | | | | | | | | | | |
|   LOAD DRIVERS | 0 | 0 | 0 | X | X | 0 | 0 | 0 | 0 | 1 | 0 | 1 |
|   MEASURE RECEIVERS | 0 | P | P | X | X | 0 | 0 | 0 | 0 | 1 | 0 | 1 |

Figure 6

SCAN CONTROL LOGIC

APPARATUS FOR SCAN TESTING CMOS INTEGRATED SYSTEMS

FIELD OF THE INVENTION

The present invention relates to test circuitry included within Complementary Metal Oxide Semiconductor (CMOS) integrated circuit chips for functional testing of the chip during fabrication and after assembly and connection into a printed circuit board with other circuit components.

BACKGROUND OF THE INVENTION

Very large scale integrated (VLSI) circuit chips are conventionally formed on a single wafer of silicon which is then scribed to facilitate breaking out of individual chips for separate packaging. Since the packaging of an individual chip adds significantly to its manufacturing cost, it is desirable to fully test the individual chips while they are still an integral part of the wafer to avoid the expense of packaging a defective chip. There are several types of tests commonly performed on the individual chips including generally, functional tests for proper circuit operation, electrical parameter tests for correct input and output signal characteristics, and delay tests for circuit operations at the requisite speeds.

Testing chips when they are part of the wafer requires a method for getting signals into, and reading signals from, the chip's input/output (I/O) pads. Probe mechanisms have been developed to satisfy this need. A probe is a mechanical arm, electriclly conductive, with a fine point on one end to make electrical contact with an I/O pad; the other end of the probe being wired to electronic testers. Probe systems have been fabricated that have as many probes as the number of I/O pads on the chip being tested. The contact ends of the probes are arranged in the same pattern as the I/O pads such that when the chip is aligned under the probes, an electrical signal from the tester causes the probe points to lower and make contact with the I/O pads.

When contact is made with all the I/O pads, test patterns can be applied to the input pads and a clock signal, if necessary, is generated by the tester and sent to the appropriate input pad. The response of the circuitry on the chip to the input signals can then be read by the tester through the probes connected to the output pads. The tester can compare the output pattern read from the chip to the pattern that is expected, based upon the input pattern, and determine if the chip is functioning correctly. Such probe systems thus perform the functional test requirement of testing chips while still part of the wafer.

Such probe systems are also used for delay measurements by the use of special test chips. These test chips are placed at strategic locations relative to the array of desired functional chips, thereby using up space on the wafer that could otherwise be used for additional functional chips. The test chips have a small number of I/O pads and the delay test is performed using a probe mechanism that is different from that used for functional tests of the other chips. Because of the small number of I/O pads on the test chip, the probe arms on the delay tester can be made very small. Therefore, the inductance of the probe arms does not affect the delay test results. Since each test chip displaces a potentially usable functional chip, only a small number of test chips are used on each wafer.

If an entire wafer is not rejected based upon the results of the delay testing of the special chips on the wafer, then all the functional chips that passed functional tests must still be delay tested after being individually packaged.

Performing delay tests on a normal chip in VLSI technology has not heretofore been practical for two major reasons: (1) circuit delays decreased; and (2) the number of I/O pads increased as VLSI technology developed.

The decrease in circuit delays mean that the time between the application of the input pulses and the detection of the output pulse becomes smaller, dictating a more precise measurement of the time involved if the answers are to be meaningful. As the circuit density of the chip and the number of I/O pads increased, the size of the chip did not increase in the same proportion. In fact, as the number of I/O pads on a chip increased, they had to be made smaller and closer together.

The end of the probe arm which is wired to the tester is much wider than the contact end. Therefore, the row of probe arms along each side of a chip form a "fan", narrow at the probe end and wide at the end wired to the tester. Since a chip is typically square, with I/O pads and probe arms along each side, as the number of I/O pads increased, the length of the probe arm has to increase because the four "fans" get wider at the tester end of the probe arm. This increased probe length adds significant inductance to the test circuits used for delay testing.

The rise and fall times of the signals generated and measured must be small compared to the delay being measured. Further, the switching point of the output signal, with respect to the switching point of the input signal, must be measured more accurately. However, the inductance of the longer probe distorts the signals used for the delay test, lengthening the otherwise fast rise or fall times. Thus, even though a delay can be measured, the time between the switchings of the first input circuit and last output circuit can not be determined with enough accuracy to make a go/no-go decision.

Recent advances in VLSI technology have included integral test circuitry consisting of a shift register around the periphery of the chip. The shift register has a stage, or storage location, physically corresponding to each of the I/O pads of the chip. The shift register is normally used by the tester to functionally test the chip. Schemes of this type are disclosed in the literature (see, for example, U.S. Pat. Nos. 4,495,628 and 4,495,629 and 4,587,480).

In these known testing schemes, additional circuitry is used to gate a signal from the output of the shift register, with one inversion, back into the shift register. All stages of the shift register are held open so that the signal repeatedly passes through the shift register and can be monitored on the output. When the shift register is used in this manner, it is called a ring oscillator. Each stage of the ring oscillator causes a double inversion of the signal so the signal that appears at the output, because of the single inversion of the additional circuitry, is the inversion of what the tester originally sent. The additional circuitry gates this output signal back to the tester for detection, as well as to the inverter to circulate through the ring oscillator again. The transit time of the signal through all the stages of the ring oscillator is a measure of the delay of the circuits on the chip.

If conventional testing methods are used, the cost of testing an integrated circuit chip will increase exponentially as the complexity of the chip increases. In the ASIC (Application Specific Integrated Circuit) market, VLSI chips can be fabricated with several tens of thousands of logic gates. These chips are typically manufactured in small quantities (10 to 1000) compared to large quantities (one million) for a custom chip. In small manufacturing quantities, the cost of generating the test patterns can be greater than the deisgn and fabrication cost for the chip.

Individual VLSI chips which successfully pass testing while still integrally a part of the wafer are then scribed and broken free for individual packaging and re-testing and subsequent assembly and connection with other components into more comprehensive circuits, usually on printed circuit (PC) boards. A PC board may contain more than one hundred of these chips and more than ten thousand interconnecting wires. A PC board of this complexity can not be assembled without errors. Therefore a test of this PC board must not only detect errors, it must collect enough information to determine the cause of the error and the repair procedure. The cost of generating a test pattern and testing such a PC board can be prohibitively high if conventional test methods are used.

Adding logic gates to a VLSI chip to improve the testability is a practical and economical method of solving the testing problem at the chip level, at the PC board level, and at the system level. It is well known in the state of the art that scan logic in a chip can divide a chip into islands of combinational logic such that computer algorithms can be used to automatically generate high quality test patterns at very low cost. However even with scan logic, the cost is very high for generating adeqzuate test patterns and fault repair procedures for complex PC boards. It is frequently desirable to perform substantially the same circuit tests on individual VLSI circuit chips at each stage of fabrication, manufacturing and assembly to develop comp rative data that can characterize defects or unacceptable production practices which destroy circuits or denigrate circuit performance. It is desirable to electrically isolate the chip from the PC board for certain test procedures.

This electrical isolation from the PC board would allow the chip input pads to be driven from the scan ring and the chip output pads to be measured by the scan ring without regard to the logic state of the other chips on the board. In this manner chip testing at the board level could be done with the same test pattern that was used at wafer probe.

The scan rings could also be used to drive the output pads on one chip while measuring the input pads on other chips on the PC board and thus test the board wiring interconnections. If the internal logic of the chip was electrically isolated from the PC board, the chip would not have to be considered when testing the board wiring. The PC board interconnection test patterns could be automatically generated from the PC board wiring list, and since each pad of each VLSI chip on the PC board could be either driven or measured, PC board wiring and assembly errors could be isolated so that repair procedures could easily be generated.

SUMMARY OF THE INVENTION

In accordance with the present invention, additional integrated circuitry is included that can scan and can electrically isolate the I/O pads of a VLSI chip in response to a special set of test patterns which can be applied and similarly reapplied at all levels of fabrication. Such test patterns, once generated can then be applied during wafer testing, and packaged chip retesting, and in-circuit testing of the VLSI chip when fully assembled and connected in printed circuit board configuration. The I/O pad scan circuitry includes a level sensitive clocked shift register that is built as part of each I/O pad driver and that forms a scan ring around the edge of the chip. This circuitry is connected to the chip I/O pads in parallel with the I/O driver and also in series between the I/O driver and the internal circuitry of the chip.

The scan circuitry has two connections to the data path of each I/O pad. One is to the chip I/O pad and the other is to the output of a tri state buffer (TSB) which is one gate away from the I/O pad for selectively isolating the chip from the I/O pads (and a PC board connected thereto). Each shift register input is connected to the output of the adjacent I/O pad, forming a ring around the chip which is connected to scan control logic circuitry that is formed on one corner of the chip.

Test patterns are serially entered through the scan control logic circuitry via five additional I/O pads on the chip. These patterns are transferred between the shift register and the I/O drivers through transmission gates (TXG) which are bi-directional devices. In this manner, the chip can be functionally tested by applying the test patterns to these five test pads along with requisite clocking signals. A wafer probe tester therefore need only connect to less than ten chip I/O pads, regardless of the total number of I/O pads on the chip. The same testers can be used to functionally test the chip in the package and, with additional analog circuits and connections to each chip I/O pad, can also be used to check the bonding wire and DC characteristics of each I/O driver, as packaged.

The scan ring is also used to test the chip when it is connected and assembled on a printed circuit board during board test procedures, or when the board is installed in a system. The tri-state buffers, in series with each I/O path, can disconnect the chip from the board so that the scan ring can be used to test each chip with the same functional test pattern that was used at wafer-probe and packaged chip tests. The scan ring can then drive the chip output drivers and measure data received by the chip input buffers to check board interconnections.

DESCRIPTION OF THE DRAWINGS

FIG. 6 is a table of signal conditions associated with operation of the scan-ring control circuitry within several modes of operation.

DESCRIPTION OF THE PREFERRED EMBODIMENT

Figure 1:
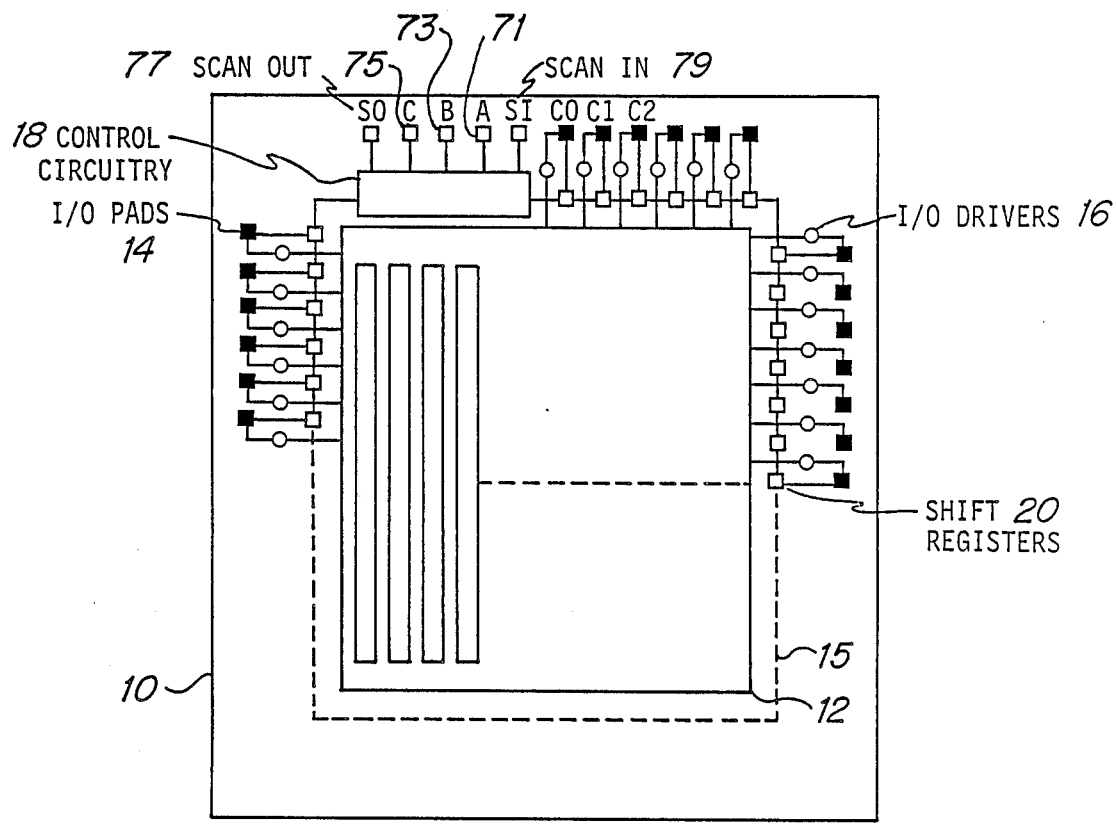
FIG. 1 is a pictorial representation of a VLSI circuit chip including a scan-ring of shift registers located around the perimeter of the chip.

Referring now to FIG. 1, there is shown a pictorial representation of a VLSI circuit chip 10 having a scan-ring 15 of shift registers 20 fabricated around the perimeter of the chip 10 and connected to the I/O pads 14 via I/O drivers 16. Scan ring control circuitry 18 including additional circuit I/O pads 71 79 is fabricated on the chip, as shown near the upper left corner, electrically connected to the scan-ring 15. The integrated circuit 10 uses CMOS VLSI and may include several hundred I/O pads 14. Five of the I/O pads labeled SI, A, B, C, and SO are connected to the control circuitry 18. A shift register 20, with a stage connected to each pad 14 (with the exception of the test pads mentioned above and the pads dedicated to ground and power supply connections), is normally used for functionally testing the chip, and is used as a ring oscillator when performing delay measurements. These operations are all controlled by the input/output control and clock control circuitry 18, as more fully described in the aforementioned U.S. Pat. No. 4,587,480.

Figure 2:
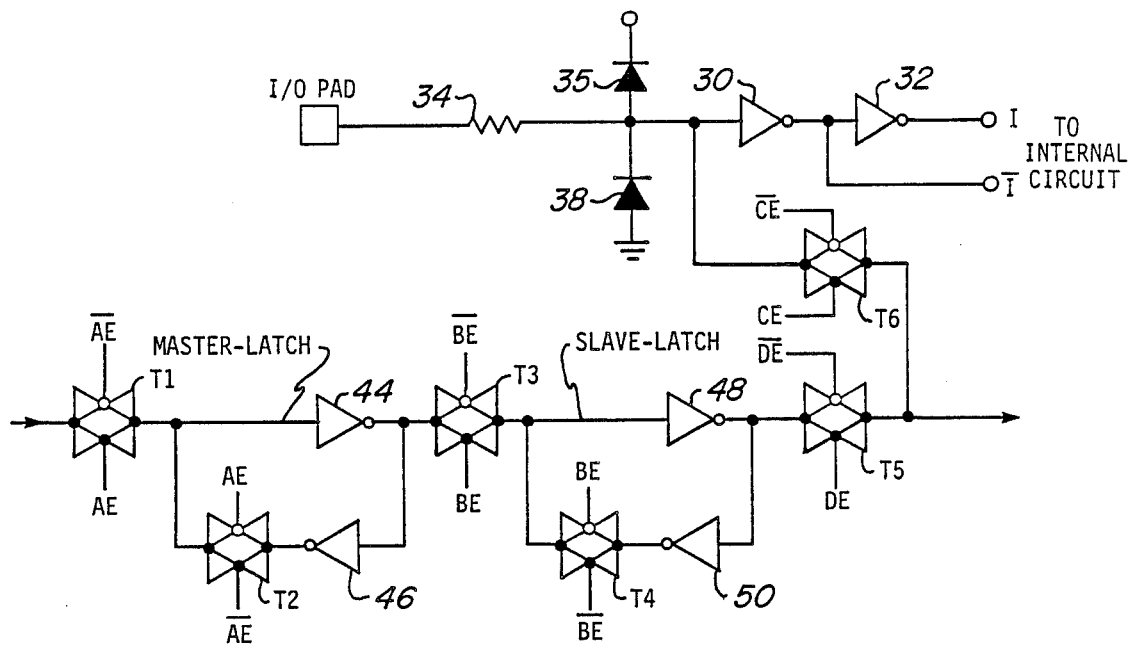
FIG. 2 is a schematic diagram of conventional latch circuitry associated with an input pad.
Figure 3:
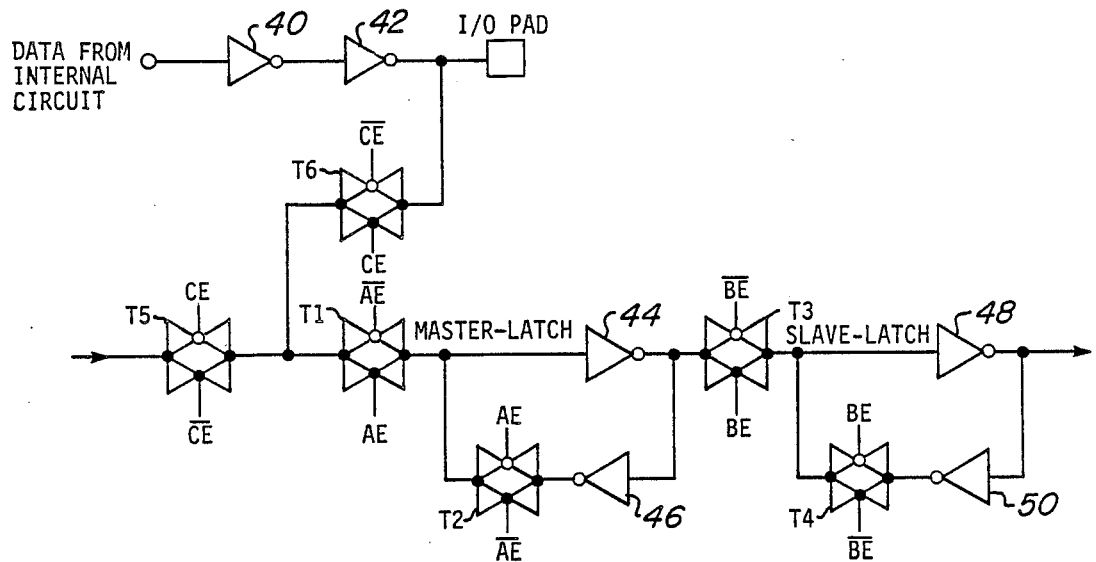
FIG. 3 is a schematic diagram of conventional latch circuitry associated with an output pad.

FIGS. 2 and 3 each show a conventional shift register stage and I/O circuitry for an individual pad. Each shift register stage includes four inverters, 44, 46, 48 and 50, and six transmission gates T1–T6. When the shift register is used as a ring oscillator, the transmission gates T1, T3 and T5 are turned on by control signals that allow a signal applied at the first stage of the ring oscillator to be propagated to the output of the last stage. Each stage has two inverters so the output polarity of each stage of the ring oscillator is the same polarity as the input polarity. The signal goes through five circuit delays at each stage of the ring oscillator; that is, each of the three transmission gates and the two inverters each have one circuit delay associated therewith.

Figure 4:
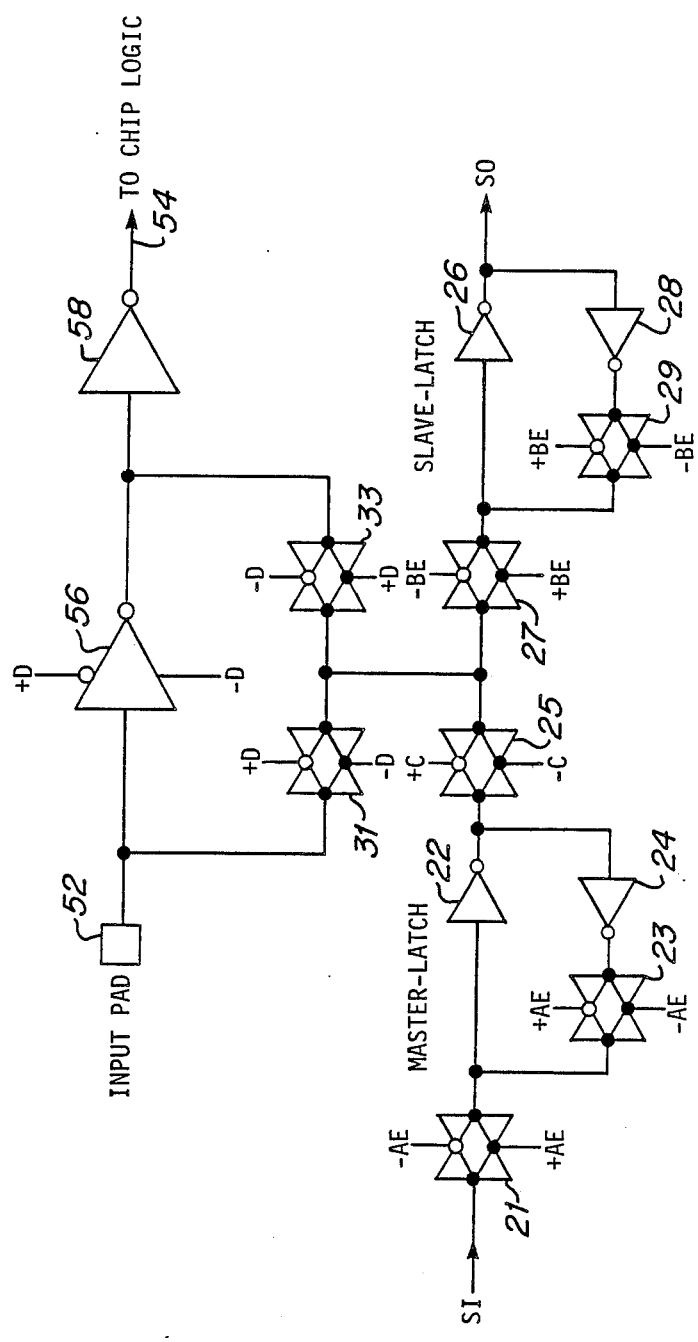
FIG. 4 is a schematic diagram of improved scan ring control circuitry associated with an input pad according to the present invention.
Figure 5:
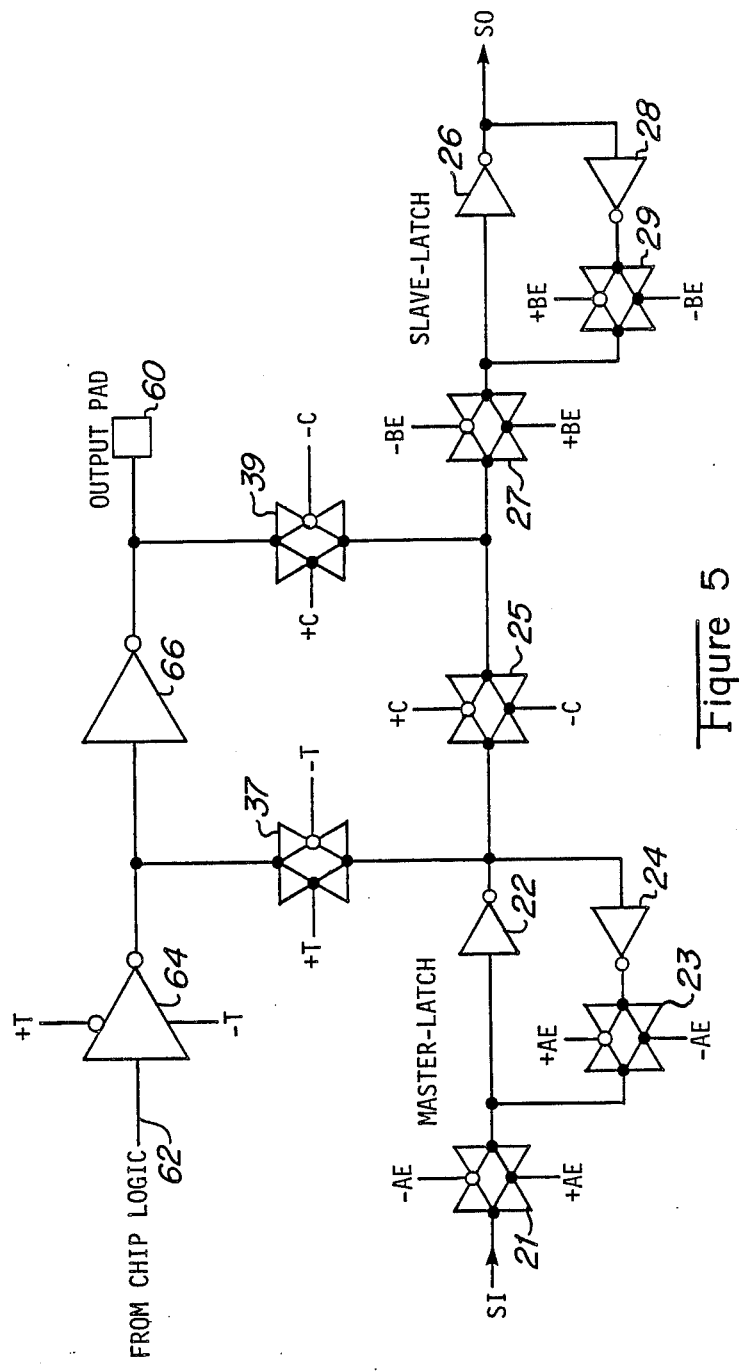
FIG. 5 is a schematic diagram of improved scan ring control circuitry associated with an output pad according to the present invention.

Referring now to FIGS. 4 and 5, there are shown shift register stages and I/O circuitry according to the present invention for each I/O pad. FIG. 4 shows a shift register stage associated with an input pad while FIG. 5 shows a shift register stage associated with an output pad. Each shift register stage includes four inverters 22, 24, 26, 28 and five bi-directional transmission gates 21, 23, 25, 27 and 29. In the present invention, the shift register can be used as a ring oscillator with the transmission gates 21, 25 and 27 turned on by control signals. This allows a signal that is applied at the first stage of the ring oscillator to be propagated to the output of the last stage. Each stage has two inverters so the output polarity of each stage of the ring oscillator is the same as the input polarity. The signal goes through five circuit delays at each stage of the ring oscillator; that is, each of the three transmission gates and the two inverters contribute one circuit delay associated therewith.

In addition, there are two bi-directional transmission gates 31 and 33 coupling the latches of a shift register stage with the input circuitry, as shown in FIG. 4, and two bi-directional transmission gates 37 and 39 coupling the latches of the shift register stage with the output circuitry, as shown in FIG. 5. The input circuitry between I/O pad 52 and the chip logic circuitry 54 includes a tri-state buffer 56 and an inverter 58, as shown in FIG. 4. Similarly, the output circuitry between I/O pad 60 and the chip logic circuitry 62 also includes a tri-state buffer 64 and an inverter 66, as shown in FIG. 5. Each of the transmission gates 21, 23, 25, 27 and 29 in a shift register stage, and each of the transmission gates 31 and 33, 37 and 39 coupling the shift register stage to the input/output circuitry, and each of the tri-state buffers 56 and 64 is activated by control signals A, B, C, D, E and T, as later described herein. The tri-state buffers 56 and 64 are of conventional design. These buffers are controlled by signals D and T to operate as inverters if the control signals are false or to produce a high impedance output if the control signals are true. These tri-state buffers are needed when the VLSI chip is mounted on a printed circuit board to electrically isolate the chip from the board.

In the normal mode of operation the control signals AE, BE, C, T, and D are all set to the 0 state. In this mode, the tri-state buffers act as inverters. Buffer 56 is used as an input buffer to receive a signal from the input pad 52 and transmit it to the internal chip logic 54 through inverter 58. Buffer 64 is used to transmit a signal from the internal chip logic 62 to the output buffer 66 which drives the output pad 60.

When performing the wafer probe test of the chip, the signals D and T are set to the "0" state to use tri-state buffers 56 and 64 as inverters. There is no external probe connection to input pad 52 or output pad 60. With the signal D set at "0", transmission gate 31 is on and thus connects data from the external scan ring to the input of buffer 56 to drive the internal logic of the chip. To measure the signal value on an output pad, the control signal C is set to "1" and a positive pulse is applied to the shift clock BE causing the output pad data value to be latched into the slave latch in the external scan ring. In this manner the chip can be tested at wafer probe without making probe contact to any of the normal signal input or output pads on the chip.

With the chip mounted on a printed circuit board, the signal D can be set to "1" which puts the tri-state buffer 56 into the high impedance state and turns on transmision gate 33. In this condition, data from the external scan ring drives the internal chip logic through inverter 58. In this manner, all data inputs to the chip are electrically isolated from the printed circuit board so that the chip can be tested without regard to the logic state of any other chip on the board. When the chip inputs are isolated from the board, the internal logic of the chip can be tested with the same test pattern that was used at wafer probe, thus eliminating the need to generate a new logic test pattern for the printed circuit board.

With the signal D set at "0" and the signal T at "1", the internal logic of the chip is isolated from the printed circuit board so that the output buffer 66 can be driven by transmission gate 37 from data in the external scan ring. The output buffer 66 drives data through the printed circuit board wiring and into another chip input pad 52. Input pad 52 is connected to the external scan ring through transmission gate 31. In this manner the printed circuit board wiring can be tested without regard to the state of the logic in any chip on the board. Because each output pin can be driven directly from external scan ring data and each input pin can be connected to the external scan ring for measurement, the test pattern generation for the printed circuit board wiring can be done automatically at low cost and defects in the board interconnections can be easily diagnosed.

The control logic for operating the circuitry of the present invention in these various operating modes is set forth in the truth table of FIG. 6 in which "1" designates the active or enabled condition, "0" designates the inactive or inhibited condition, "P" designates pulsed, "X" designates don't care, "D" designates serial input data, and "M" designates measurement of output data. The control logic circuitry 18 for operating the shift register stages and associated stages of input/output circuitry and coupling circuitry according to the aforementioned operating modes may be fabricated near the outer perimeter of an integrated circuit chip 10, as shown in FIG. 1, and may be assembled as shown in the illustrations (a), (b), (c), and (d) of FIGS. 7(a) and 7(b) to operate on applied A and B shift clock signals, a C control signal, a Scan data In (SI) signal, and a Scan data Out (SO) signal, as shown in illustration (a) of FIG. 7B and in illustration (b) of FIG. 7(A). From these signals, additional internal control signals D, E, R and T are derived from the logic circuitry as shown in illustration (c) of FIG. 7A. Additionally, the logic circuitry shown in illustration (d) of FIG. 7B produces the control signals that are used in the logic circuitry shown in illustration (c) of FIG. 7A and that are applied to the transfer gates 21–29 in the master and slave latches of the shift register.

Figure 7:
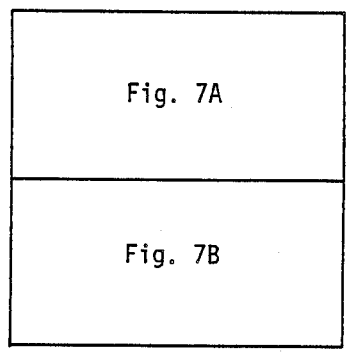
FIGS. 7A, including the illustrations (b) and (c) and 7B, including the illustrations (a) and (d) comprise a block schematic circuit diagram of scan-ring control circuitry according to the present invention for generating the control signal conditions listed in FIG. 6.
Figure 7A:
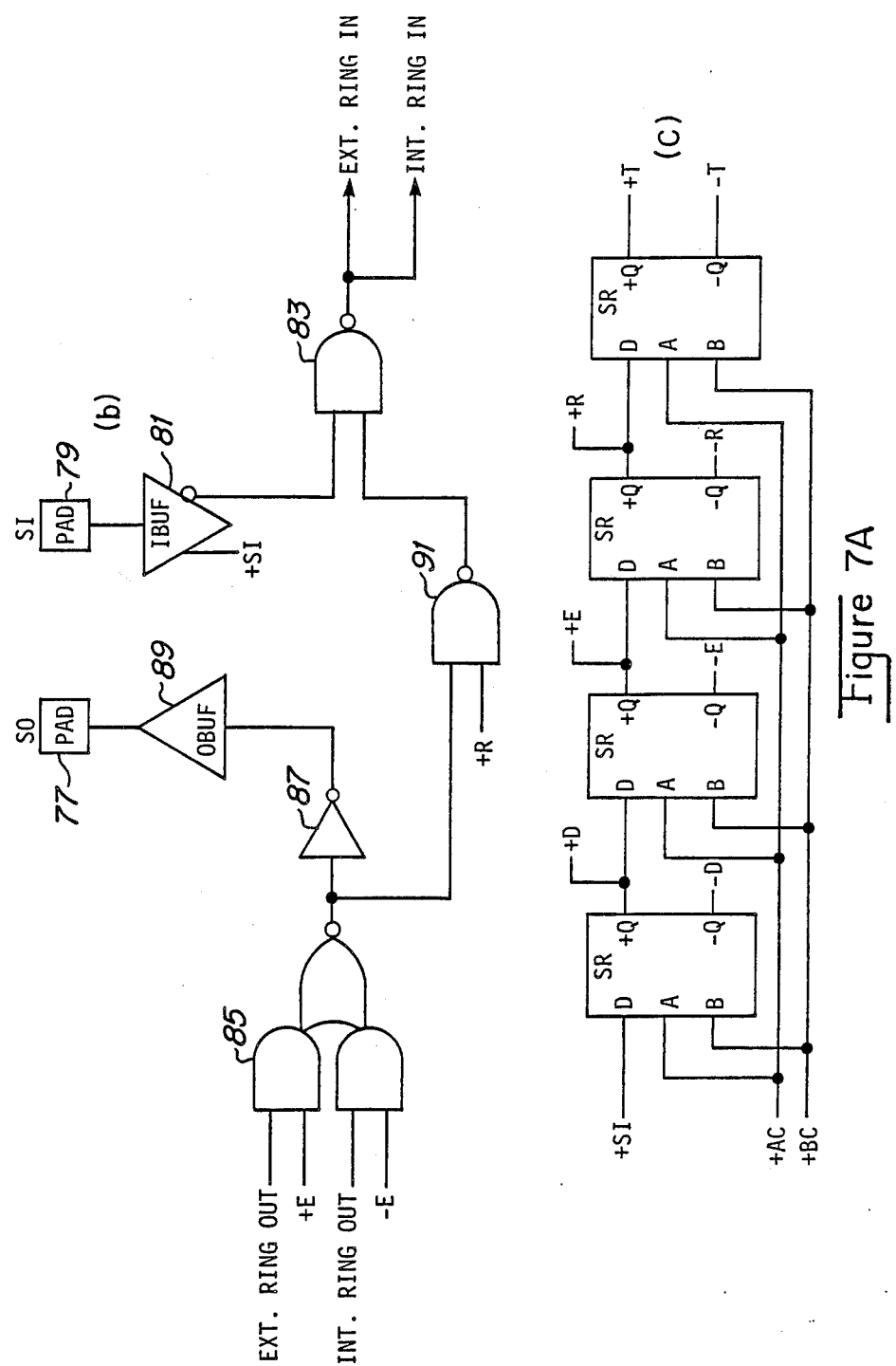
Figure 7B:
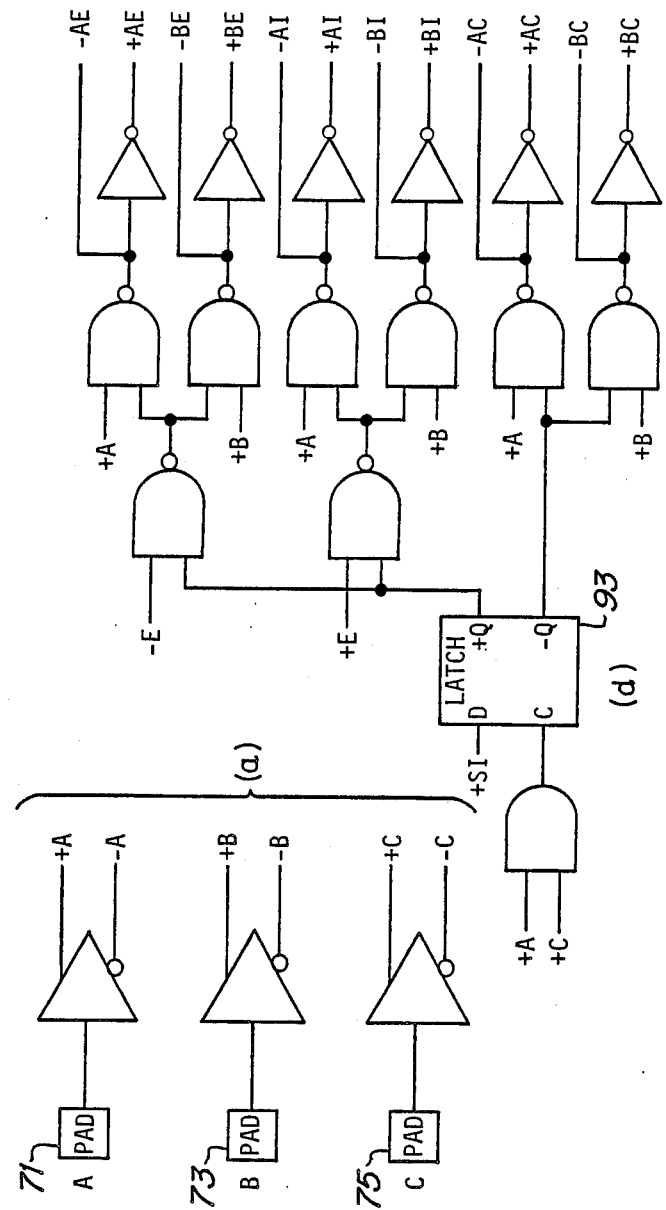

In operation, the scan control logic circuitry 18 of the present invention interfaces the wafer-probe pads 71–79 to the scan rings formed about the perimeter of a CMOS chip. This logic circuitry, as illustrated in FIG. 7A and 7B, connects to the A and B shift clock pads 71 and 73, the C control pad 75, the SI pad 79, and the SO pad 77. The SI pad 79 connects through an input buffer 81 to one input of NAND gate 83 which drives the data input to the scan rings in the chip. The scan ring that connects to the I/O drivers around the edge of the chip is referred to as the External Ring while the ring connecting the latches in the main body of the chip is referred to as the Internal Ring. The outputs from the last stages of these two scan rings are connected to two separate ports of an AOI22 multiplexor 85 which is of conventional design and which drives an inverter 87 that is connected to the SO pad 77 via an output buffer 89. The NAND gate 91 also receives the output of multiplexer 85 on one input and the R control line (later described) at the other input and applies its output to the other input of NAND gate 83.

Illustrations (c) of FIG. 7A shows a four-stage shift register with its input connected to the SI output of buffer 81. This four-bit register is the control register and is used to store the states of the D, E, R, and T control lines. Loading of this register is controlled by the latch 93 shown in illustration (d) of FIG. 7B. The logic value on the SI pad 79 is loaded into the latch 93 when both A and C are high. A "0" from latch 93 blocks the shift clocks from the scan rings and enables the shift clocks to the control register shown in illustration (c) of FIG. 7A so that the four bits can be loaded. A "1" in the latch 93 blocks the shift clocks from the control register and enables the clocks to the scan rings. The E control bit enables External or Internal ring scan. The C, D, and T bits drive the transmission gates 21–29 and the tri-state buffers 56, 64 of the external scan ring as shown in FIGS. 4 and 5. The R control bit is applied to other input of the NAND gate 91 which is used to invert the output of the shift register and feed it back into the input to form a ring oscillator for speed measurement. The AOI22 multiplexer 85 is used to select either the internal or external shift register output to drive the output buffer 89 and the NAND gate 91. This NAND gate 91 thus selects either the SI or the compliment of the SO data as input to the scan ring.

As illustrated in the truth table of FIG. 6, the signal values applied to the chip testing input pads and to the control register shown in illustrations (c) of FIG. 7A control the various modes of operation of the scan rings previously described. All pads are set to "0" when the chip is powered up ("0"=low). The "Conrol Shift On" and "Control Shift Off" operating modes are used to set the latch 93 that enables shifting into the control register shown in illustrations (c) of FIG. 7A, as previously described. Four sets of non overlapped shift clock pulses are applied to the A and B probe pads to shift data from the SI pad 77 into the control register shown in illustration (c) of FIG. 7A.

For normal system operation, the shift clocks are off, the stages of the control register are set to zeros and system clocks are applied to the C0, C1, and C2 pads, as required.

The "Propagate", "Oscillate", and "Scan" modes operate on either the external or internal scan ring, depending upon the value of control bit E. The "Propagate" mode requires both the A and B scan clocks to be on at the same time. This causes a direct path from the SI pad 79 through all the latches in the ring to the SO pad 77. A "1" on SI pad 79 should result in a "1" on SO pad 77, and a "0" on SI pad 79 should result in a "0" on SO pad 77. This is a very simple test that checks the operation of a large number of gates and is used just after the chip is powered up in a tester to verify that a chip is operable.

For a more specific test of the operating characteristics of a chip, the "Ring Oscillate" mode is used for making a very accurate measurement of the circuit propagation delay within the chip. It can be used at all levels of testing from wafer probe to system test in order to monitor chip performance. If R=1 and both the "A" and "B" shift clocks are on, there is a direct path through all the shift registers in a ring and the inverted output is put back into the ring through the input multiplexor 85. This mode of operation causes the ring to become a ring oscillator and the frequency of oscillation can be monitored on the SO pad 77. When R="1", the SI pad 79 acts as a gate to the ring oscillator, and SI="0" turns the ring on.

The "Scan" mode is used to shift data into either the internal or the external scan rings, depending upon the value of the "E" control bit. After the scan rings have been loaded, the system clocks must be cycled once in the "Load Inputs" mode to allow data to propagate from the input pads to internal latches or from internal latches to output pads. The "Measure Outputs" mode strobes the value of the output buffers into the external shift ring.

The "PCB Wiring Test" mode requires the T control bit to be on ("1"=on), which puts the tri-state buffer 64 into its high impedance state so that the value in the shift ring can be directed through the transmission gate 37 to the output buffer 66. The "Measure Receivers" mode strobes the values from input pads 52 through the transmission gate 31 into the shift ring to verify continuity of associated PC board wiring after the packaged chip has been assembled and connected with other components on the PC board.

Therefore, the IC testing circuit and method of the present invention uses tri-state buffers along with scanring logic and control elements fabricated on the IC chip to permit testing of the chip during fabrication, after wire bonding and packaging, and while assembled with other components on a printed circuit board. Various operating modes are controlled by logic signals applied to less than ten signal pads to initialize, control and test internal circuit conditions.

I claim:

1. An integrated circuit having internal functional circuitry integrally formed on a chip with testing circuitry, where the testing circuitry includes an interconnected plurality of shift register stages and control circuitry therefor integrally formed near the perimeter of the chip with signal pads disposed near the perimeter of the chip for supplying signals to the functional circuitry and to the testing circuitry, the integrated circuit comprising:

buffer means selectably operable in one of three logic operating states coupled between a signal pad and the functional circuitry of the chip; and transfer gating means connected for selectively intercoupling the buffer means and selected ones of the plurality of shift register stages for bidirectionally transferring signals between the corresponding signal pad and shift register stage in response to control signals applied to the transfer gating means from said control circuitry.

2. An integrated circuit as in claim 1 wherein said shift register stages are controllable by said control circuitry to selectively allow applied signals to pass therethrough; and said buffer means is operable in response to different applied control signals in a first operating state for testing the chip without contacting the signal pads for the functional circuitry, and is operable in a second operating state for electrically isolating the functional circuitry from the associated signal pads and circuitry connected thereto for testing the functional circuitry of the chip, and is operable in a third operating state for electrically isolating the functional circuitry from the signal pads for testing circuitry connected to the signal pads without regard for the functional circuitry of the chip.

3. An integrated circuit as in claim 1 wherein each of said stages of the shift register includes a master latch at the input of the stage and a slave latch at the output of the stage coupled by a serially-connected pair of controllable transfer gating means therebetween; and an additional transfer gating means is coupled between the junction of said serially-connected pair of transfer gating means and said buffer means.

4. An integrated circuit as in claim 3 wherein the buffer means includes a tri-state buffer stage that inverts signal applied thereto, and an inverter coupled to the output of the buffer stage; and said additional transfer gating means is coupled between said junction and the output of said inverter; and an auxiliary transfer gating means is coupled between the junction of the buffer stage and inverter and the output of the master latch.

5. An integrated circuit as in claim 3 wherein the buffer means includes a tri-state buffer stage that inverts signal applied thereto, and an inverter coupled to the output of the buffer stage; and said additional transfer gating means is coupled between said junction and the output of said buffer stage; and an auxiliary transfer gating means is coupled between said junction and the input of the buffer stage.

6. An integrated circuit as in claim 2 wherein said buffer means includes a pair of stages sequentially connected between a signal pad and the functional circuitry of the chip, the first of the pair of stages being operable in one of three logic operating states and having an output coupled to the second of the pair of stages and to a transfer gating means.

7. An integrated circuit as in claim 6 wherein each of the pair of stages of the buffer means operatively provides signal inversion therethrough.

* * * * *